United States Patent
Hagemeyer

(10) Patent No.: US 8,026,758 B2
(45) Date of Patent: Sep. 27, 2011

(54) FM DEMODULATOR

(75) Inventor: Frank Hagemeyer, Wedemark (DE)

(73) Assignee: Sennheiser electronic GmbH & Co. KG, Wedemark (DE)

(*) Notice: Subject to any disclaimer, the term of this patent is extended or adjusted under 35 U.S.C. 154(b) by 133 days.

(21) Appl. No.: 12/558,349

(22) Filed: Sep. 11, 2009

(65) Prior Publication Data

US 2010/0085116 A1 Apr. 8, 2010

(30) Foreign Application Priority Data

Sep. 12, 2008 (DE) .................. 10 2008 047 111

(51) Int. Cl.
*H03D 3/00* (2006.01)

(52) U.S. Cl. .................. 329/320; 329/318; 329/344

(58) Field of Classification Search .................. 329/315, 329/318–320, 344; 327/39
See application file for complete search history.

(56) References Cited

U.S. PATENT DOCUMENTS 3,621,409 A * 11/1971 Kazutoshi .................. 329/331

FOREIGN PATENT DOCUMENTS

| DE | 653313 | 11/1937 |
| DE | 2948336 A1 | 11/1979 |
| EP | 1780887 A1 | 5/2007 |
| JP | 11195928 A | 7/1999 |

* cited by examiner

*Primary Examiner* — David Mis
(74) *Attorney, Agent, or Firm* — Kilpatrick Townsend & Stockton LLP

(57) ABSTRACT

There is provided an FM demodulator comprising a transistor (Q323), a filter unit for producing first and second amplitude-modulated signals from a received frequency-modulated signal, wherein the filter unit is coupled to the switching transistor (Q323), and first and second diodes (D300) connected in opposite relationship for rectifying the first and second amplitude-modulated signals of the filter unit. The filter unit has an LC network and is so dimensioned that there is a linear relationship between the output voltage and the input frequency. The demodulator further has an operating point adjusting unit for adjusting an operating point of the transistor. The operating point adjusting unit (100) is adapted to effect operating point adjustment with a noise negative feedback.

7 Claims, 3 Drawing Sheets

FM DEMODULATOR

CROSS-REFERENCE TO RELATED APPLICATIONS

This application claims priority to German Patent Application No. 10 2008 047 111.9, filed Sep. 12, 2008, the disclosure of which is hereby incorporated by reference in its entirety.

BACKGROUND

The present invention concerns an FM demodulator.

FM demodulators for example with a Gilbert cell have been known for many years.

The known solutions however suffer from the disadvantage that the circuits must be balanced and that there are magnetically coupled coils.

As general state of the art attention is directed to EP 1 780 887 A1, DE 29 48 336 A1, JP 11-195928 A and DE 653 313.

Thus an object of the present invention is to provide a substantially balancing-free FM demodulator which requires a small amount of space and involves a low current demand.

SUMMARY

That object is attained by an FM demodulator as set forth in claim 1.

Thus there is provided an FM (frequency modulation) demodulator comprising a transistor, a filter unit for producing first and second amplitude-modulated signals from a received frequency-modulated signal, wherein the filter unit is coupled to the switching transistor, and first and second diodes connected in opposite relationship for rectification of the first and second amplitude-modulated signals of the filter unit. The filter unit has an LC network and is so dimensioned that there is a linear relationship between the output voltage and the input frequency. The demodulator further has an operating point adjusting unit for adjusting an operating point of the transistor, wherein the operating point adjusting unit is adapted to effect an operating point adjustment with a noise negative feedback.

In accordance with an aspect of the present invention the filter unit has an inductor as a series coupling element for reducing harmonics at the output of the transistor.

In accordance with a further aspect of the present invention the first and second diodes are arranged parallel to the voltages to be rectified and an inductor is coupled between the first and second diodes in such a way that the first diode, the inductor and the second diode form a series circuit at the output of the demodulator with a low output impedance.

The invention also concerns an FM demodulator comprising a transistor, and a filter unit for producing first and second amplitude-modulated signals from a received frequency-modulated signal. The filter unit is coupled to the transistor. The filter unit has an LC network and is so dimensioned that there is a linear relationship between the output voltage and the input frequency. The demodulator further has first and second diodes connected in opposite relationship for rectifying the first and second amplitude-modulated signals of the filter unit. The filter unit has an inductor as a series coupling unit for reducing harmonics at the output of the transistor.

The invention also concerns an FM demodulator comprising a transistor, and a filter unit for producing first and second amplitude-modulated signals from a received frequency-modulated signal. The filter unit is coupled to the transistor. The filter unit has an LC network and is so dimensioned that there is a linear relationship between the output voltage and the input frequency. The demodulator has first and second diodes connected in opposite relationship for rectifying the first and second amplitude-modulated signals. The first and second diodes are arranged in parallel with the voltages to be rectified and an inductor is coupled between the first and second diodes in such a way that the first diode, the inductor and the second diode form a series circuit at the output of the demodulator with a low output impedance.

The invention concerns the notion of providing an FM demodulator at low cost and without magnetically coupled coils, without tapped coils, without balancing elements, with a low distortion factor (0.05%, 66 dB) and of low noise.

For that purpose there can be provided a negative-feedback demodulator having two series-connected diodes. Two resonances which are symmetrically displaced around the intermediate frequency can be produced by means of the circuit according to the invention comprising commercially available fixed inductors and capacitors. The FM demodulator according to the invention is in that respect tolerance-insensitive so that it is possible to dispense with balancing. The two diodes serve to rectify the IF (intermediate frequency) voltages. As the two diodes are connected in series in opposite relationship the sums of the rectified voltages on the center frequency are equal to zero. In the event of a deviation from the intermediate frequency IF the output voltage is proportional to the intermediate frequency.

The circuit according to the invention makes it possible to achieve a balancing-free FM demodulator with a very high signal-noise ratio of for example 95 dB, with a low distortion factor of 0.05%, 66 dB, with very good temperature stability of 0.1 dB to 70° C. That can be effected in particular based on commercially available and inexpensive standard components and involving a low power consumption, for example 2.7 V at 3 mA.

The invention is based on the realisation that in many known FM demodulators the input signal is converted into an amplitude-modulated signal and then demodulated by means of an AM demodulator, which is typically effected by means of a diode as an envelope curve detector.

The FM demodulator according to the invention provides a demodulator which does not require any balancing, which does not have any magnetically coupled coils, which does not have any coils with a tapping, which has a high signal-noise ratio with a low distortion factor, which does not require additional frequency conversion, which only has a low dc power consumption and which requires only a few inexpensive standard SMD components.

The demodulator according to the invention provides a solution with a low level of power consumption, which is balancing-free and at the same time involves a low level of distortion attenuation. In particular the combination of low distortion attenuation and signal-noise ratio is advantageous. The demodulator according to the invention can have a sum (sum characteristic) of the distortion factor and the signal-noise ratio of 160 dB.

To improve the FM demodulator, three measures can be implemented in combination or independently of each other. Those three measures represent the provision of an operating point adjusting unit for low-noise and negative-feedback adjustment of the operating point of the HF transistor, the provision of a series inductor for the reduction of harmonics and the provision of a series circuit comprising two diodes connected in opposite relationship and a coil for reducing the output impedance of the circuit.

The FM demodulator according to the invention can be used in a wireless receiver for example for a wireless microphone, a wireless pocket transmitter, a wireless handheld transmitter or a wireless camera transmitter.

Further configurations of the invention are subject-matter of the appendant claims.

BRIEF DESCRIPTION OF THE DRAWINGS

Advantages and embodiments by way of example of the invention are described in greater detail hereinafter with reference to the drawings.

DETAILED DESCRIPTION

Figure 1A:
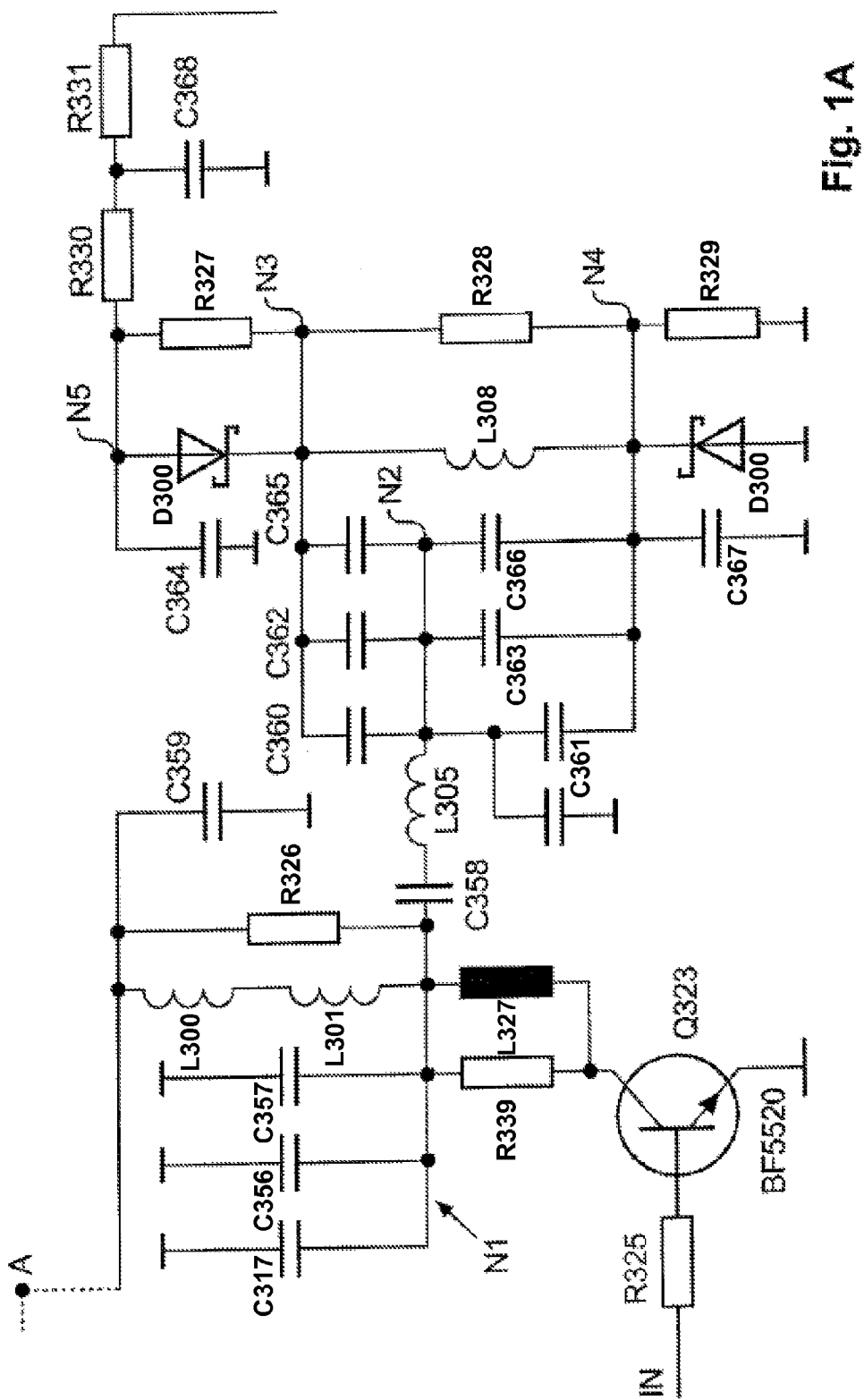
FIG. 1A shows a diagrammatic view of a circuit diagram of an FM demodulator according to a first embodiment.

FIG. 1A shows a diagrammatic view of a circuit of an FM demodulator according to a first embodiment. The FM demodulator produces two amplitude-modulated signals from the input signal (frequency-modulated signal). Amplitude demodulation is effected by rectification of the two amplitude-modulated signals.

The circuit of FIG. 1 has a terminal A to which a coil L300, a resistor R326 and a capacitor C359 are coupled. The resistor R326 is in turn coupled to a first node N1. A further coil L303 is provided between the coil L300 and the node N1. Three capacitors C317, C356 and C357 are coupled between the node N1 and ground M. A parallel circuit comprising a resistor R339 and a coil L327 is coupled to a transistor Q323 and the collector terminal of the HF (high frequency) transistor respectively. A resistor R325 is coupled to the base terminal of the transistor Q323. A series circuit comprising a capacitor C358 and a coil L305 is coupled between the first node N1 and a second node N2. Three capacitors C360, C362, C365 are connected in parallel between the second node N2 and a third node N3. Three capacitors C361, C363, C366 are also connected in parallel between the second node N2 and the fourth node N4. A coil L308 and a resistor R328 are connected between the second and fourth nodes. A capacitor C367, a diode D300 and a resistor R329 are connected between the fourth node N4 and ground M. A diode D300 and a resistor R327 are coupled between the third node N3 and a fifth node N5. A series circuit comprising a resistor R330 and R331 is also coupled to the fifth node N5. A capacitor C368 is coupled to ground at the center point between the two resistors R330, R331.

An input signal IN is applied to the resistor R325 which in turn is coupled to the base terminal of the transistor Q323. BY way of example the frequency of the input signal is 10.7 MHz at a level of −15 dBm and with a frequency deviation of 50 kHz. The operating voltage of 2.1 V, 3 mA is fed to the transistor by way of the capacitor C359.

Provided at the collector of the transistor Q323 is a filter unit comprising for example four fixed inductors and for example thirteen capacitors (that is to say an LC network). The output voltage of the filter unit is rectified by means of the two diodes D300. The two diodes are connected in series in respect of direct current by way of the coil L308. As the two diodes are connected in anti-serial relationship a difference in respect of the rectified voltages is produced at the capacitor C364. The resistor R330 and the capacitor C368 form a low pass filter which eliminates the intermediate frequency and harmonics thereof so that only the demodulated LF signal remains at the output.

The two diodes D300 are preferably connected directly in series without thermally noisy resistors. In that way the LF (low frequency) output resistance can be approximately equal to twice the dynamic resistance of the diodes. The dc load resistors R327, R329 are respectively disposed in parallel with the diodes D300 and further reduce the output resistance. It is to be noted in that respect that the thermal noise of the load resistors R329, R327 is short-circuited by the dynamic resistances of the diodes and therefore does not need to be further taken into consideration.

The two diodes D300 serve for rectification at the output node N5. The lower diode D300 is connected with one of its terminals to ground and the other terminal is coupled to the coil L308. The upper diode D300 is coupled between the node N5 (output) and a second terminal of the coil L308. Thus the output impedance of the circuit is jointly determined by the two diodes D300 and the coil L308.

The resistors R330 and R331 are not necessarily part of the demodulator so that the output of the demodulator is at the node N5. A low output impedance of for example 1 k ohm can be produced with LF (low frequency) signals, with the series circuit comprising the two diodes D300 and the coil L308.

The circuit according to the invention is advantageous because the entire LC network is so dimensioned that there is a linear relationship between the output voltage and the input frequency. That can be achieved in particular by band filter coupling between the resistors comprising C357, C356, C317, L301, L300, C360, C361, C362, C363, C365, C366 and L308. In addition an inductor L305 is provided as a (series) coupling element. That inductor provides that the harmonics of the intermediate frequency are filtered or kept away from the diodes D300. The diodes form wideband rectifiers which demodulate the noise of the fundamental wave and all harmonics. The noise at the output of the demodulator can be reduced by low pass coupling to the coil L305.

The diodes D300 and their load resistors are disposed directly in parallel with the HF voltages to be rectified. Thus a dynamic output resistance of the circuit can be implemented about an order of magnitude less than in the case of known solutions. That further allows a reduction in the noise at the output of the demodulator. A very low AM (amplitude modulation) noise can be implemented by virtue of the operating point stabilisation of the HF transistor to be actuated, and that also has a positive effect in terms of output noise.

In principle the resonances of the circuit are provided in mutually displaced relationship or displaced relative to each other. If the coil L308 has a tolerance the displacement between the resonances is maintained so that it is possible to achieve a linear characteristic between the input signal and the output signal. The coil L308 can involve for example 2% tolerance.

The low noise of the circuit can be achieved by the provision of only a few noise sources. The two diodes D300 admittedly represent noise sources but they have a relatively low dynamic output resistance. The remaining passive components such as capacitor coils and resistors do not contribute to the noise of the circuit.

The HF switching transistor Q323 can be operated at a stable operating point so that this transistor also does not contribute substantially to the noise of the circuit. Just the provision of operating point stabilisation in respect of the transistor Q323 makes it possible to avoid or save on 15 dB noise. The HF switching transistor Q323 serves for AM suppression of the input signal. The transistor Q323 can receive an actuating power of −15 dBm, the transistor amplifies by about 40 dB and provides a square-wave output signal by switching to and fro. The amplitude noise is further limited thereby.

The HF transistor Q323 is coupled to the filter unit extending from the capacitor C317 to the capacitors C364, C365, C366 and C367. The filter unit also includes the attenuation resistors R326, R327, R328 and R329. The correct circuit quality is set by virtue of those resistors. It should be pointed out once again that the filter unit represents an LC filter combination.

As an alternative to the FIG. 1A circuit, the coil L308 can be divided into two coils in series or parallel for coarse compensation of the voltage induced by external magnetic fields.

Figure 1B:
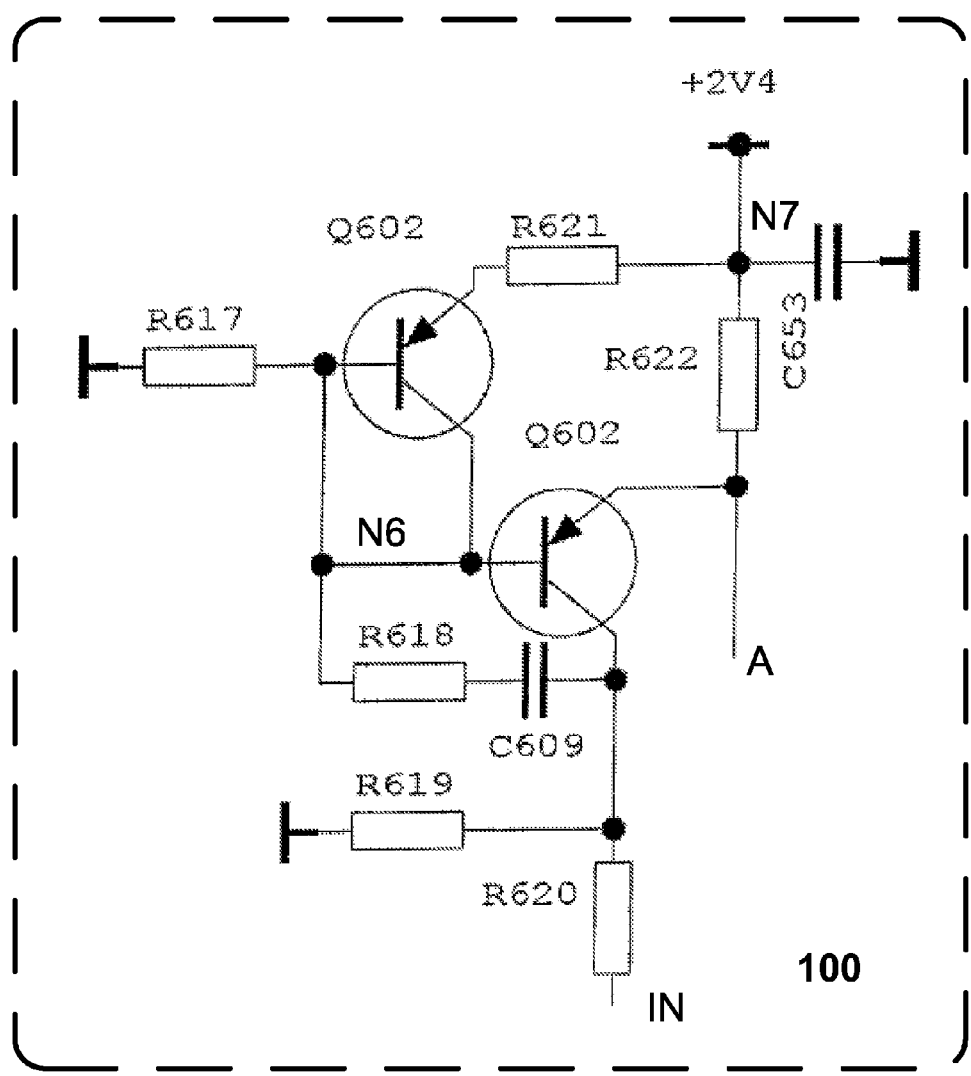
FIG. 1B shows a diagrammatic view of a circuit diagram of an operating point adjusting unit according to the first embodiment.

FIG. 1B shows a diagrammatic view of a circuit diagram of an operating point adjusting unit according to the first embodiment. That operating point adjusting unit is provided at the input of the FM demodulator of FIG. 1A. In particular the operating point adjusting unit 100 is connected to the terminals A and IN. The operating point adjusting unit 100 serves in that respect to adjust the operating point of the HF switching transistor Q323.

The operating point adjusting unit 100 has two transistors Q602, and six resistors R617, R618, R619, R620, R621 and R622. The operating point adjusting unit further has two capacitors C609 and C653. Furthermore the operating point adjusting unit has two nodes N6, N7. The capacitor C653 is coupled between the node N7 and ground. In addition two resistors R621, R622 are coupled between the node N7 and the emitter terminals of the transistors Q602. The collector terminal of the first transistor Q602 is coupled to the base terminal and the node N6 of the second transistor Q602 respectively. A resistor R618 is connected in series with a capacitor C609 between the collector terminal of the second transistor Q602 and the base terminal of the second transistor Q602 and the node N6 respectively. In addition the node N6 and the base terminal of the second transistor Q602 are respectively coupled to the base terminal of the first transistor Q602. A resistor R617 is coupled between the base terminal of the first transistor Q602 and ground.

A resistor R620 is coupled between the collector terminal of the second transistor Q602 and the input terminal IN and a resistor R619 is coupled between the collector terminal of the second transistor Q606 and ground.

The collector current of the HF transistor Q323 and the noise current can be detected by means of the resistor R622. The noise components can be amplified by the transistor Q602 and those noise components can be negatively fed back by way of the resistor R620. The noise voltage at the output of the demodulator can be reduced by up to 20 dB by that noise negative feedback.

The upper transistor Q602 has a short-circuit between base and collector and thus serves as a diode. The lower transistor Q602 is in the form of an amplifier in a base circuit. The upper transistor Q602 is thus connected as a diode and provides that the circuit can be operated in substantially temperature-independent fashion. Without the upper current Q602 the quiescent current of the lower transistor Q602 would be heavily temperature-dependent. Thus the upper transistor Q602 connected as a diode serves for temperature compensation.

The lower transistor Q602 is in the form of an amplifier in a base circuit and serves for negative feedback of the noise components. The noise voltage is dropped at the resistor R622 and is fed by way of the emitter of the lower transistor Q602 to the base circuit and goes out by way of the collector via the terminal IN and the resistor R325 to the HF switching transistor Q323. Noise suppression of 20 dB can be achieved by virtue of the configuration of the operating point adjusting unit 100.

The operating point adjusting unit 100 serves also to regulate out the operating point of the transistor. In that way it is possible to achieve a very low amplitude noise at the output of the transistor. Furthermore low-noise operating point adjustment can be achieved thereby. In that case low-frequency noise components can be negatively fed back to the base. The noise of the transistor can be negatively fed back by the operating point adjusting unit.

The operating point adjusting unit serves to suppress noise (the unit regulates not only at 0 Hz but up to some 100 kHz). That is effected for example by the above-described negative feedback. This means that the noise of the HF transistor Q323 can be regulated out.

The operating point stabilisation of the HF switching transistor is implemented by the operating point adjusting unit 100 and in particular by the transistor Q602.

With the series coil L305 it is possible to permit low pass coupling which cuts off harmonics of 10.7 MHz and noise components thereof. That can lead for example to a reduction in the noise voltage of about 20 dB.

The harmonics can be filtered or kept away from the diodes D300 by the series coil L305.

The band width of the modulator according to the invention is some MHz and thus the output voltage is very small at a 48 kHz deviation. That could result in an inadequate signal-noise ratio, without noise suppression.

The FM demodulator according to the invention is advantageous because it is of a low-noise configuration. That low-noise configuration is achieved inter alia by the series coupling coil L305 serving to provide that the noise of the harmonics is not rectified. In addition the noise voltage of 10.7 MHz can be rectified. That means that the noise components of the harmonics are lost.

The series coil L305 acts as a low pass in the FM demodulator. That can be achieved for example by parallel connection of the capacitors C317, C356, C357. That parallel circuit comprising the three capacitors serves for short-circuiting harmonics. In addition to the parallel circuit comprising the three capacitors, the series coil L305 serves for short-circuiting of the harmonics. In that way the noisy harmonics can be removed without their having to be rectified.

A linear demodulator can be provided by virtue of the configuration of the demodulator shown in FIG. 1A.

Figure 2:
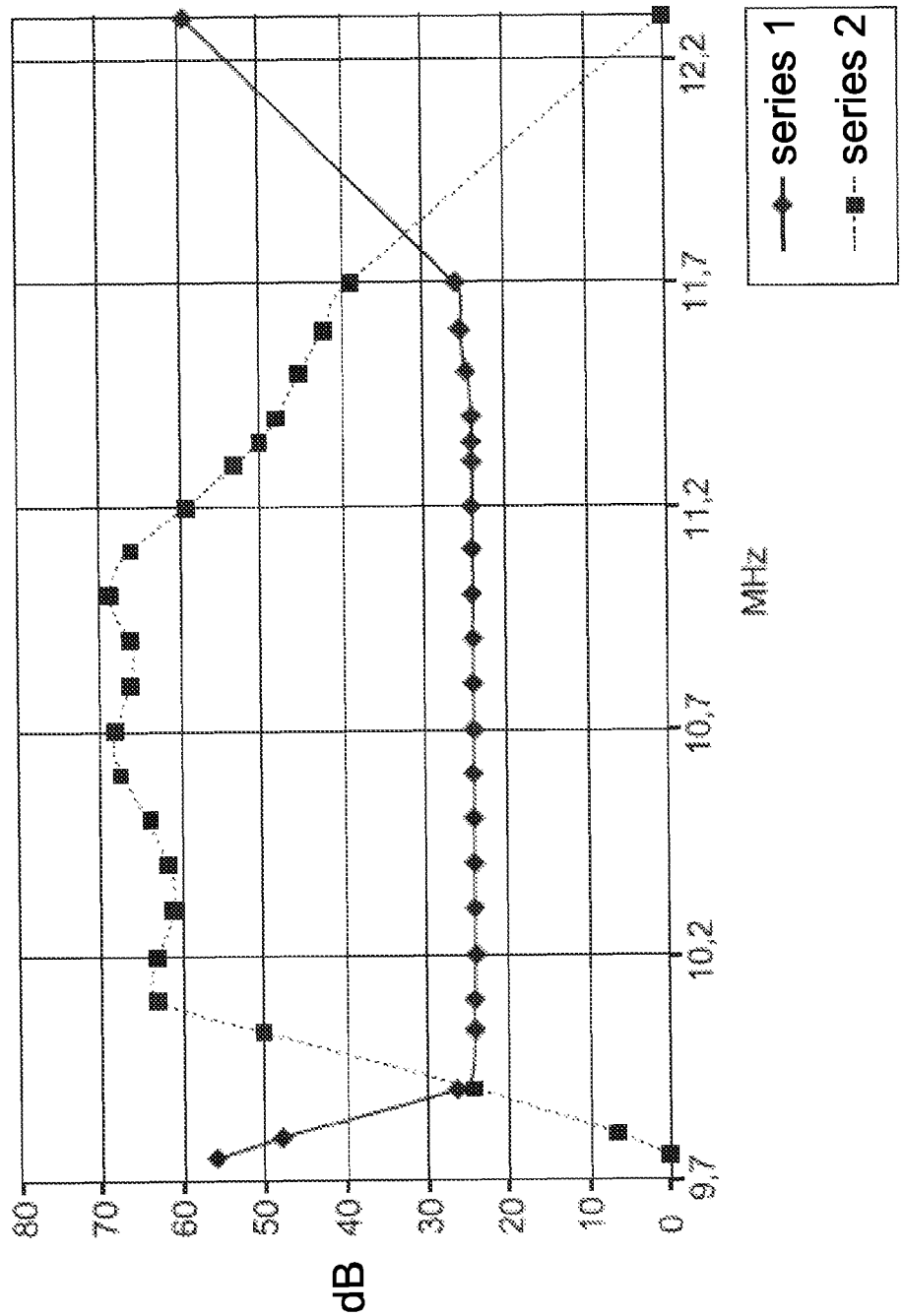
FIG. 2 shows a diagrammatic view of an output voltage and distortion attenuation for an FM demodulator according to the first embodiment.

FIG. 2 shows a graph representation of the output voltage and distortion attenuation in dependence on frequency.

By virtue of the series circuit of the diodes noise reduction follows the AM demodulation. It is possible to regulate against a dc voltage noise by virtue of operating point stabilisation of the transistor.

The diodes supply an AM noise voltage in the positive region and the other diode supplies a noise voltage in the negative region. That provides for demodulation of the AM noise, in phase opposition. It should be pointed out that the output voltage at the node N5 is 0 volt. If the transistor draws more current then each diode will in itself provide a higher rectified voltage, that is to say there is a dc voltage of about 2 volts at the node N4 and 0 volt at N5. It is possible in that way to provide that the amplitude noise of the transistor Q323 is avoided.

Distortion attenuation is plotted in FIG. 2 against the output voltage. The relationship shown in FIG. 2 is made possible by the two diodes D300. Offset voltages can occur at the output by virtue of the fact that there are tolerances in manufacture of the diodes D300.

The FM demodulator according to the invention is balancing-free because the FM demodulator is very wideband (9.7-11.7 MHz (about 2 MHz)). In contrast thereto the FM deviation is only 48 kHz.

The above-described FM demodulator can be used in a wireless receiver. That wireless receiver can receive for example signals from a wireless microphone, a wireless handheld transmitter, a wireless pocket transmitter or a wireless camera transmitter.

The invention claimed is:

1. An FM demodulator comprising:
a transistor,
a filter unit for producing first and second amplitude-modulated signals from a received frequency-modulated signal, wherein the filter unit is coupled to the transistor,
wherein the filter unit has an LC network and is so dimensioned that there is a linear relationship between the output voltage and the input frequency,
first and second diodes connected in opposite relationship for rectification of the first and second amplitude-modulated signals of the filter unit, and
an operating point adjusting unit for adjusting an operating point of the transistor, wherein the operating point adjusting unit is adapted to effect an operating point adjustment with a noise negative feedback.

2. An FM demodulator as set forth in claim 1 wherein the filter unit has an inductor as a series coupling element for reducing harmonics at the output of the transistor.

3. An FM demodulator as set forth in claim 1 wherein the first and second diodes are arranged parallel to the voltages to be rectified and an inductor is coupled between the first and second diodes in such a way that the first diode, the inductor and the second diode form a series circuit at the output of the demodulator with a low output impedance.

4. A wireless receiver having an FM demodulator as set forth in claim 1.

5. An FM demodulator comprising:
a transistor,
a filter unit for producing a first amplitude-modulated signal from a received frequency-modulated signal, wherein the filter unit is coupled to the transistor,
wherein the filter unit has an LC network and is so dimensioned that there is a linear relationship between the output voltage and the input frequency,
first and second diodes connected in opposite relationship for rectification of the first and second amplitude-modulated signals of the filter unit,
wherein the filter unit has an inductor as a series coupling element for reducing harmonics at the output of the transistor.

6. An FM demodulator as set forth in claim 5 wherein the first and second diodes are arranged parallel to the voltages to be demodulated and an inductor is coupled between the first and second diodes in such a way that the first diode, the inductor and the second diode form a series circuit at the output of the demodulator with a low output impedance.

7. An FM demodulator comprising:
a transistor,
a filter unit for producing a first amplitude-modulated signal from a received frequency-modulated signal, wherein the filter unit is coupled to the transistor,
wherein the filter unit has an LC network and is so dimensioned that there is a linear relationship between the output voltage and the input frequency,
first and second diodes connected in opposite relationship for rectification of the first and second amplitude-modulated signals of the filter unit,
wherein the first and second diodes are arranged parallel to the voltages to be demodulated and an inductor is coupled between the first and second diodes in such a way that the first diode, the inductor and the second diode form a series circuit at the output of the demodulator with a low output impedance.

* * * * *

UNITED STATES PATENT AND TRADEMARK OFFICE
CERTIFICATE OF CORRECTION

PATENT NO. : 8,026,758 B2
APPLICATION NO. : 12/558349
DATED : September 27, 2011
INVENTOR(S) : Hagemeyer It is certified that error appears in the above-identified patent and that said Letters Patent is hereby corrected as shown below:

In the Specification:

In column 1, line 16, please insert a --,-- before and after "however".

In column 1, line 19, please insert a --,-- after "art".

In column 1, line 21, please insert a --,-- after "Thus".

In column 1, line 29, please insert a --,-- after "Thus".

In column 1, line 43, please insert a --,-- after "invention".

In column 1, line 46, please insert a --,-- after "invention".

In column 2, line 14, please insert a --,-- after "purpose".

In column 2, line 17, please insert a --,-- after "circuit".

In column 2, line 18, please insert a --,-- after "invention".

In column 2, line 19, please insert a --,-- after "demodulator".

In column 2, line 20, please insert a --,-- after "invention".

In column 2, line 24, please insert a --,-- after "relationship".

In column 2, line 26, please insert a --,-- after "frequency".

In column 2, line 26, please delete "IF".

In column 2, line 30, please insert a --,-- before and after the phrase "for example".

In column 2, line 32, please insert a --,-- before and after the phrase "in particular".

In column 2, line 34, please insert a --,-- after "example".

In column 2, line 36, please insert a --,-- after "that".

In column 2, line 37, please insert a --,-- after "demodulators".

In column 2, line 41, please insert a --,-- before and after the phrase "according to the invention".

In column 2, line 46, please delete "dc" and insert --DC--.

In column 2, line 49, please insert a --,-- before and after the phrase "according to the invention".

Signed and Sealed this
Twenty-fifth Day of June, 2013

Teresa Stanek Rea
*Acting Director of the United States Patent and Trademark Office*

CERTIFICATE OF CORRECTION (continued)
U.S. Pat. No. 8,026,758 B2

In column 2, line 51, please insert a --,-- before and after the phrase "at the same time".

In column 2, line 52, please insert a --,-- after "particular".

In column 2, line 54, please insert a --,-- before and after the phrase "according to the invention".

In column 2, line 66, please insert a --,-- before and after the phrase "according to the invention".

In column 2, line 67, please insert a --,-- before and after the phrase "for example".

In column 3, line 3, before "subject-matter", please insert --the--.

In column 3, line 8, please insert a --,-- before and after the phrase "by way of example".

In column 3, line 12, please insert a --,-- after "demodulator".

In column 3, line 14, please insert a --,-- after "unit".

In column 3, line 17, please insert a --,-- after "demodulator".

In column 3, line 24, please insert a --,-- after "demodulator".

In column 3, line 54, please delete "BY" and insert --By--.

In column 3, line 55, please insert a --,-- after "example".

In column 3, line 60, please insert a --,-- before and after the phrase "for example".

In column 4, line 7, please delete "dc" and insert --DC--.

In column 4, line 18, please insert a --,-- after "Thus".

In column 4, line 23, please insert a --,-- before and after the phrase "for example".

In column 4, line 32, please insert a --,-- after "addition".

In column 4, line 48, please insert a --,-- after "principle".

In column 4, line 50, please insert a --,-- after "tolerance".

In column 4, line 53, please insert a --,-- before and after the phrase "for example".

In column 4, line 57, please insert a --,-- after "sources".

In column 4, line 59, please insert a --,-- before "such".

In column 4, line 59, please insert a --,-- after "resistors".

In column 5, line 10, please insert a --,-- before and after the phrase "once again".

In column 5, line 18, please insert a --,-- after "particular".

In column 5, line 21, please insert a --,-- before and after the phrase "in that respect".

In column 5, line 29, please insert a --,-- after "addition".

In column 5, line 37, please insert a --,-- after "addition".

In column 5, line 58, please delete "the upper current" and insert --the current of upper transistor--.

In column 5, line 58, please insert a --,-- after "Q602".

In column 5, line 60, please insert a --,-- after "Thus".

In column 6, line 5, please insert a --,-- after "way".

In column 6, line 7, please insert a --,-- after "Furthermore".

In column 6, line 8, please insert a --,-- after "case".

CERTIFICATE OF CORRECTION (continued)
U.S. Pat. No. 8,026,758 B2

In column 6, line 14, please insert a --,-- before and after the phrase "for example".

In column 6, line 19, please insert a --,-- before and after the phrase "in particular".

In column 6, line 20, please insert a --,-- after "L305".

In column 6, line 22, please insert a --,-- before and after the phrase "for example".

In column 6, line 26, please insert a --,-- before and after the phrase "according to the invention".

In column 6, line 38, please insert a --,-- before and after the phrase "for example".

In column 6, line 39, please insert a --,-- after "circuit".

In column 6, line 40, please insert a --,-- after "capacitors".

In column 6, line 49, please insert a --,-- after "diodes".

In column 6, line 51, please delete "dc" and insert --DC--.

In column 6, line 58, please insert a --,-- after "current".

In column 6, line 59, please delete "dc" and insert --DC--.

In column 6, line 60, please insert a --,-- before and after the phrase "in that way".

In column 7, line 3, please insert a --,-- after "thereto".

In column 7, line 6, please insert a --,-- after "receive".

In column 7, line 7, please insert a --,-- after "example".